(12) United States Patent
Neumann et al.

(10) Patent No.: US 11,600,723 B2
(45) Date of Patent: Mar. 7, 2023

(54) TRANSISTOR DEVICE AND METHOD OF FABRICATING A GATE OF A TRANSISTOR DEVICE

(71) Applicant: Infineon Technologies Austria AG, Villach (AT)

(72) Inventors: Ingmar Neumann, Villach (AT); Michael Hutzler, Villach (AT); David Laforet, Villach (AT); Roland Moennich, Klagenfurt (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 46 days.

(21) Appl. No.: 17/163,744

(22) Filed: Feb. 1, 2021

(65) Prior Publication Data

US 2021/0249534 A1  Aug. 12, 2021

(30) Foreign Application Priority Data

Feb. 6, 2020 (EP) .................................. 20155979

(51) Int. Cl.
| | |
|---|---|
| *H01L 29/78* | (2006.01) |
| *H01L 29/40* | (2006.01) |
| *H01L 29/66* | (2006.01) |
| *H01L 29/06* | (2006.01) |
| *H01L 29/423* | (2006.01) |

(Continued)

(52) U.S. Cl.
CPC .. *H01L 29/7813* (2013.01); *H01L 21/823462* (2013.01); *H01L 29/0649* (2013.01); *H01L 29/0696* (2013.01); *H01L 29/401* (2013.01); *H01L 29/404* (2013.01); *H01L 29/407* (2013.01); *H01L 29/4236* (2013.01); *H01L 29/42356* (2013.01); *H01L 29/42364* (2013.01); *H01L 29/66666* (2013.01); *H01L 29/66734* (2013.01); *H01L 29/7811* (2013.01);

(Continued)

(58) Field of Classification Search
CPC ............. H01L 29/7811; H01L 29/0649; H01L 29/7813; H01L 29/0696; H01L 29/42356; H01L 29/4236; H01L 29/66734; H01L 21/823462; H01L 29/404; H01L 29/407; H01L 29/42364; H01L 29/66666; H01L 29/7827
See application file for complete search history.

(56) References Cited

U.S. PATENT DOCUMENTS

| | | |
|---|---|---|
| 5,514,604 A | 5/1996 | Brown |
| 9,680,004 B2 | 6/2017 | Laforet et al. |

(Continued)

FOREIGN PATENT DOCUMENTS

WO   2005065385 A2   7/2005

*Primary Examiner* — Joseph C. Nicely
(74) *Attorney, Agent, or Firm* — Murphy, Bilak & Homiller, PLLC

(57) ABSTRACT

In an embodiment, a transistor device includes a semiconductor substrate having a main surface, a cell field including a plurality of transistor cells, and an edge termination region laterally surrounding the cell field. The cell field includes a gate trench in the main surface of the semiconductor substrate, a gate dielectric lining the gate trench, a metal gate electrode arranged in the gate trench on the gate dielectric, and an electrically insulating cap arranged on the metal gate electrode and within the gate trench.

20 Claims, 12 Drawing Sheets

(51) Int. Cl.
*H01L 21/8234* (2006.01)
*H01L 29/49* (2006.01)

(52) U.S. Cl.
CPC ........ *H01L 29/7827* (2013.01); *H01L 29/495* (2013.01); *H01L 29/4966* (2013.01)

(56) References Cited

U.S. PATENT DOCUMENTS

| | | | |
|---|---|---|---|
| 10,304,933 B1* | 5/2019 | Woo | H01L 21/3212 |
| 2003/0003637 A1* | 1/2003 | Ninomiya | H01L 29/66348 |
| | | | 257/E29.066 |
| 2005/0179082 A1 | 8/2005 | Miyata et al. | |
| 2010/0013009 A1 | 1/2010 | Pan | |
| 2010/0193901 A1* | 8/2010 | Jang | H01L 21/823437 |
| | | | 257/E21.59 |
| 2011/0018057 A1* | 1/2011 | Kim | H01L 29/78 |
| | | | 438/270 |
| 2011/0136309 A1* | 6/2011 | Grivna | H01L 29/7813 |
| | | | 438/270 |
| 2014/0175536 A1* | 6/2014 | Lee | H01L 29/1095 |
| | | | 438/270 |
| 2019/0305087 A1* | 10/2019 | Philippou | H01L 29/7397 |
| 2021/0288156 A1* | 9/2021 | Fukui | H01L 29/0878 |
| 2022/0230883 A1* | 7/2022 | Chowdhury | H01L 29/063 |

\* cited by examiner

TRANSISTOR DEVICE AND METHOD OF FABRICATING A GATE OF A TRANSISTOR DEVICE

BACKGROUND

Common transistor devices for power applications include Si CoolMOS®, Si Power MOSFETs, and Si Insulated Gate Bipolar Transistors (IGBTs). U.S. Pat. No. 9,680,004 B2 discloses a power MOSFET including a metal gate electrode in a gate trench having a stripe shape. The power MOSFET also includes a field plate in a field plate trench which has a columnar or needle shape. The field plate provides charge compensation and offers an opportunity to reduce the area specific on resistance of the MOSFET device.

Methods allowing simpler manufacturing of transistor devices including a metal gate electrode and transistor devices including a metal gate electrode having even better performance would be desirable.

SUMMARY

According to the invention, a transistor device comprises a semiconductor substrate having a main surface, a cell field comprising a plurality of transistor cells and an edge termination region laterally surrounding the cell field. The cell field comprises a gate trench in the main surface of the semiconductor substrate, a gate dielectric lining the gate trench, a metal gate electrode arranged in the gate trench on the gate dielectric and an electrically insulating cap arranged on the metal gate electrode and within the gate trench.

In some embodiments, the metal gate electrode has an upper surface that is positioned within the gate trench.

In some embodiments, the gate dielectric is a deposited layer that has a uniform thickness on the side walls of the trench.

In some embodiments, the transistor device further comprises a first electrically insulating layer arranged on the main surface of the semiconductor substrate laterally adjacent the gate trench.

In some embodiments, the first electrically insulating layer extends onto the gate dielectric.

In some embodiments, the electrically insulating cap forms part of a second electrically insulating layer that extends over the first electrically insulating layer and over the metal gate electrode positioned within the gate trench. The second electrically insulating layer is in direct contact with the upper surface of the metal gate electrode.

In some embodiments, the gate dielectric further comprises a lower dielectric layer arranged at the base of the gate trench and the gate dielectric lines side walls of the gate trench and is positioned on an upper surface of the lower dielectric layer. In some embodiments, the lower dielectric layer is formed using a HDP (High Density Plasma) deposition process.

In some embodiments, the electrically insulating cap comprises an upper dielectric layer having an upper surface that is substantially coplanar with the main surface of the semiconductor substrate.

In some embodiments, the transistor device further comprises a second electrically insulating layer that extends over the main surface of the semiconductor substrate and over the upper dielectric layer positioned in the gate trench. The second electrically insulating layer may comprise a TEOS layer, i.e. is deposited using a TEOS (Tetraethyl orthosilicate) process.

In some embodiments, the upper dielectric layer comprises a TEOS layer, i.e. is deposited using a TEOS (Tetraethyl orthosilicate) process.

In some embodiments, the metal gate electrode comprises a liner layer arranged on the gate dielectric and a filler material. The liner layer may include two or more sublayers.

In some embodiments, the liner layer comprises Ti and/or TiN. In some embodiments, the filler material comprises tungsten. In some embodiments, the liner layer comprises TiN and the filler material is formed of tungsten.

In some embodiments, the transistor device further comprises a charge compensation structure. The charge compensation structure may comprise one or more electrically conductive field plates or a superjunction structure, for example.

In some embodiments, the charge compensation structure comprises an elongate field plate in an elongate field plate trench that extends into the main surface and substantially parallel to the gate trench. Each transistor cell may include an elongate field plate so that the charge compensation structure includes a plurality of elongate field plate trenches, each including an elongate field plate.

In some embodiments, the charge compensation structure comprises a columnar field plate in a columnar field plate trench that extends into the main surface and is positioned laterally adjacent the gate trench. Each transistor cell may include a columnar field plate so that the charge compensation structure includes a plurality of columnar field plate trenches, each including a columnar field plate.

In some embodiments, the field plate comprises polysilicon. The field plate may be electrically isolated from the semiconductor substrate by an electrically insulating layer or field oxide that lines the base and side walls of the field plate trench. The field oxide may comprise silicon oxide.

The transistor device may be a MOSFET (Metal Oxide Semiconductor Field Effect Transistor) or a IGBT (Insulated Gate Bipolar Transistor) or a superjunction device.

A method of fabricating a gate of a transistor device is also provided, the transistor device comprising a semiconductor substrate having a main surface, a cell field comprising a plurality of transistor cells and an edge termination region laterally surrounding the cell field. The method comprises forming a gate trench in the main surface of the semiconductor substrate in the cell field, lining the gate trench with a gate dielectric, forming a metal gate electrode on the gate dielectric and forming an electrically insulating cap on the metal gate electrode and within the gate trench.

In some embodiments, the gate dielectric is deposited onto a base and side walls of the gate trench.

In some embodiments, method further comprises removing an upper portion of the metal gate electrode such that an upper surface of the metal gate electrode is recessed within the gate trench.

In some embodiments, the method further comprises selectively forming an first electrically insulating layer on the main surface of the semiconductor substrate laterally adjacent the gate trench.

In some embodiments, the method further comprises forming a second electrically insulating layer on the first electrically insulating layer and on the metal gate electrode in the gate trench to form the electrically insulating cap.

In some embodiments, the method further comprises forming a lower dielectric layer arranged at the base of the gate trench and forming the gate dielectric on the side walls of the gate trench and on an upper surface of the lower dielectric layer.

In some embodiments, the method further comprises forming an upper dielectric layer on the metal gate electrode to form the electrically insulating cap, the upper dielectric layer having an upper surface that is substantially coplanar with the main surface of the semiconductor substrate, and forming a second electrically insulating layer on the upper dielectric layer and on the main surface of the semiconductor substrate.

In some embodiments, the method further comprises after the formation of the electrically insulating cap, implanting a body region and a source region into the main surface of the semiconductor substrate.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1:
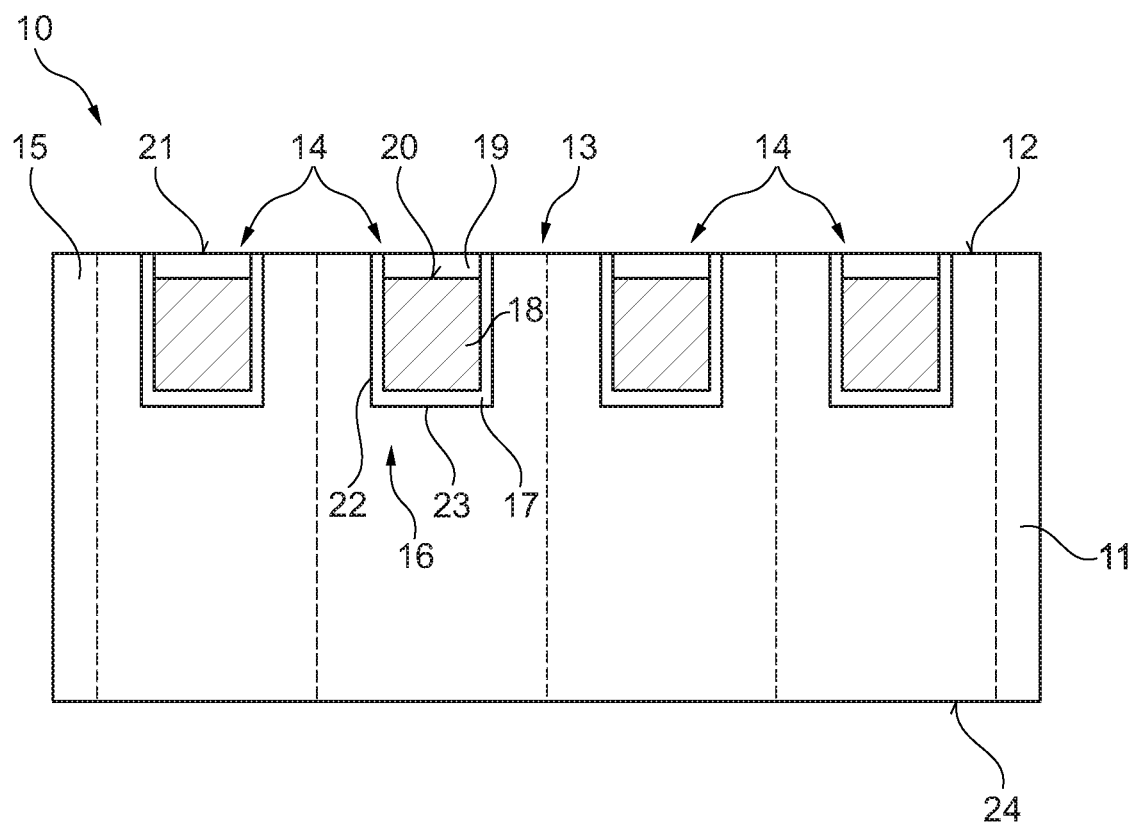
FIG. 1 illustrates a cross-sectional view of a transistor device including a gate trench according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The Figures illustrate relative doping concentrations by indicating "−" or "+" next to the doping type "n" or "p". For example, "$n^-$" means a doping concentration which is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

For modern trench power MOSFETs, the constant shrink of the dimensions in order to gain better area-specific on-resistance results in very small gate dimensions. Commonly, polysilicon which is used as gate material. For small dimensions, the sheet resistance and specific resistivity of polysilicon is relatively high which can lead to an increase of the distributed gate resistance over the chip. This can cause inhomogeneous switching over the chip as well as a slow-down in the switching speed as the gate resistance is increasing. Consequently, the possibilities for further reducing switching losses are limited and device ruggedness can be negatively affected.

One approach to mitigate these effects is based on the implementation of metal fingers which contact the polysilicon gates of the single transistor cells. However, this requires silicon area which cannot be used for switching.

Another approach is the use of metal in place of polysilicon as the gate material. The much higher conductivity of metals with respect to doped polysilicon eliminates the need for gate fingers in order to provide a homogeneous switching over the full chip and enables a reduction of the trench width. By using a metal gate, e.g. a TiN/W gate, a reduction of the specific resistivity of the gate compared to a polysilicon gate can be achieved. A metal gate offers a way of enabling lower gate dimensions and thus smaller device dimensions and improving the switching speed, as well as enabling a homogenous switching over the whole chip area. However, it is not straightforward to manufacture a silicon device with a metal gate, as this means integrating metal into the front end of line process.

Embodiments described herein provide a gate trench structure filled with a metallic gate electrode material, which is encapsulated by an electrically insulating capping layer, for example, an oxide capping layer. In some embodiments, charge-compensation by field plates in field plate trenches or needle-shaped or columnar field plates in needle-shaped or columnar field plate trenches are used.

Encapsulating the metal gate electrode according to embodiments described herein allows for the use of the standard wet chemical cleaning in the subsequent process steps during the manufacturing of the device. Therefore, this structure provides a way of overcoming many of the restrictions for the manufacturing of a metal gate device. Furthermore, the top of the gate electrode is not exposed to increased electrical fields, which is useful for increasing the lifetime of the device.

FIG. 1 illustrates a cross-sectional view of a transistor device 10 according to an embodiment. The transistor device 10 includes a semiconductor substrate 11 having a main surface 12, a cell field 13 comprising a plurality of transistor cells 14 and an edge termination region 15 which laterally surrounds the cell field 13. The plurality of transistor cells 14 in the cell field 13 may all have substantially the same structure.

The cell field 13 comprises a gate trench 16 in the main surface 12 of the semiconductor substrate 11, a gate dielectric 17 lining the gate trench 16 and a metal gate electrode 18 arranged in the gate trench and on the gate dielectric 17. An electrically insulating cap 19 is arranged on the metal gate electrode 18 and is arranged within the gate trench 16.

Each of the transistor cells 14 in the cell fields may include the same arrangement of the gate trench 16, gate dielectric 17, metal gate electrode 18 and electrically insulating cap 19. The cell field 13 contributes to the switching of the transistor device 10, whereas the edge termination region 15 serves to provide electrical isolation between the active device region, i.e. the cell field 13, and the edge region of the device.

The gate dielectric 17 may be formed by depositing a dielectric layer onto the side walls 22 and base 23 of the gate trench 16. A TEOS method may be used, for example. The thickness of the gate dielectric 17 may be more uniform if a deposition process rather than a thermal oxidation process of the semiconductor material forming the base 23 and side walls 22 of the gate trench 16 is used.

The metal gate electrode 18 may comprise a metal such as tungsten for example. In some embodiments, the metal gate electrode 18 includes two or more sublayers. In some embodiments, the metal gate electrode 18 includes one or more liner layers which are positioned on and line the gate dielectric 17 and a filler material which is positioned on the liner material and which fills the remainder of the trench, i.e. the gap surrounded by the liner layer(s), to form the metal gate electrode 18. The liner layer may be TiN and the filler material tungsten.

The metal gate electrode 18 includes an upper surface 20 which is positioned within the gate trench 16 and, therefore, at a depth from the main surface 12 within the semiconductor substrate 11. The electrically insulating layer 19 extends between and is bounded at its lateral sides by the gate dielectric 17 lining the side walls 22 of the gate trench 16.

In some embodiments, the electrically insulating cap 19 has an upper surface 21 that is substantially coplanar with the main or major surface 12 of the semiconductor substrate 11. The electrically insulating cap 19 may be positioned directly on and entirely cover the upper surface 20 of the metal gate electrode 18 at regions of the transistor device 10 positioned within the cell field 13.

The electrically insulating cap 19 serves to electrically insulate the metal gate electrode 18 from conductive layers positioned above the gate trench 16 in the cell field 13 and from subsequent process steps, for example during fabrication and implantation of the body and source regions of the transistor device and subsequent wet chemical cleaning and/or etching processes.

The use of the electrically insulating cap 19 also results in a planar surface on which a metallization structure with its interlayer dielectrics can be built up. The interlayer dielectric layers, commonly formed from undoped silicon glass (USG) and/or BPSG (borophosphosilicate glass), are however, not in direct contact with the metal gate electrode 18 in the cell field 13 due to the presence of the intervening electrically insulating cap 19 positioned in the gate trench 16 on top of the metal gate electrode 18.

An electrical contact may be made to the metal gate electrode 18 using one or more conductive vias which extend through the electrically insulating cap 19. The one or more conductive vias are, however, positioned laterally outside of the cell field 13 and in the edge termination region 15. In some embodiments, the electrically insulating cap 19 may have a lateral extent such that it does not extend into at least the region of the edge termination region 15 in which the conductive via is placed.

At positions within the cell field 13 of the transistor device 10, the metal gate electrode 18 is completely encapsulated by the dielectric material of the gate dielectric 17 and electrically insulating cap 19. At least one opening (not seen in FIG. 1) in the electrically insulating cap 19 is formed to allow a contact to the metal gate electrode 18 to be formed. The opening may be positioned in the edge termination region 15.

The semiconductor substrate 11 may be formed of a monocrystalline semiconductor substrate such as a monocrystalline silicon wafer. In some embodiments, the semiconductor substrate may be formed by epitaxial semiconductor layer, for example an epitaxial silicon layer.

The gate trench 16 may have an elongate stripe-like structure with its length extending into the plane of the drawing. The gate trenches 16 of the plurality of transistor cells 14 may extend substantially parallel to one another.

In some embodiments, the gate trench forms part of a grid structure including sections extending in different lateral directions and intersecting one another. For example, a grid of longitudinal and transverse trenches may be provided. This arrangement may be used for transistor devices including columnar field plates positioned in columnar field plate trenches, with one columnar trench being laterally surrounded by two longitudinal and two transverse sections providing a continuous, typically square, ring.

The gate trenches 16 with the gate dielectric 17, the metal gate electrode 18 and electrically insulating cap 19 may be fabricated before the body and source regions of the transistor device are implanted and after any field plate trenches are formed in the major surface 12.

The transistor device 10 may be a vertical transistor device with a drain region (not shown in FIG. 1) positioned on a second main surface 24 which opposes the main surface 12. The semiconductor substrate 11 may form the drift region of the transistor device 10 and be doped with the first conductivity type, e.g. n-type. The drain region may be highly doped with a first conductivity type, for example n-type. A body region (not shown in FIG. 1) is positioned on the drift region and the comprises dopants of a second conductivity type, e.g. p-type, which opposes first conductivity type. A source region (not shown in FIG. 1) is positioned on or in the body region and comprises dopants of a first conductivity type.

A metallic layer may be positioned on the drain region to form a drain contact for the transistor device 10 on the rear surface. A conductive layer may be positioned on the main surface 12 of the semiconductor substrate 11 on the cell field 13 which is electrically coupled to the source region and the field plates, if present, which forms a source contact for the transistor device 10. The metal gate electrodes 18 may be coupled to a gate contact for the transistor device 10 which is positioned on the main surface 12 laterally adjacent source contact.

Figure 2A:
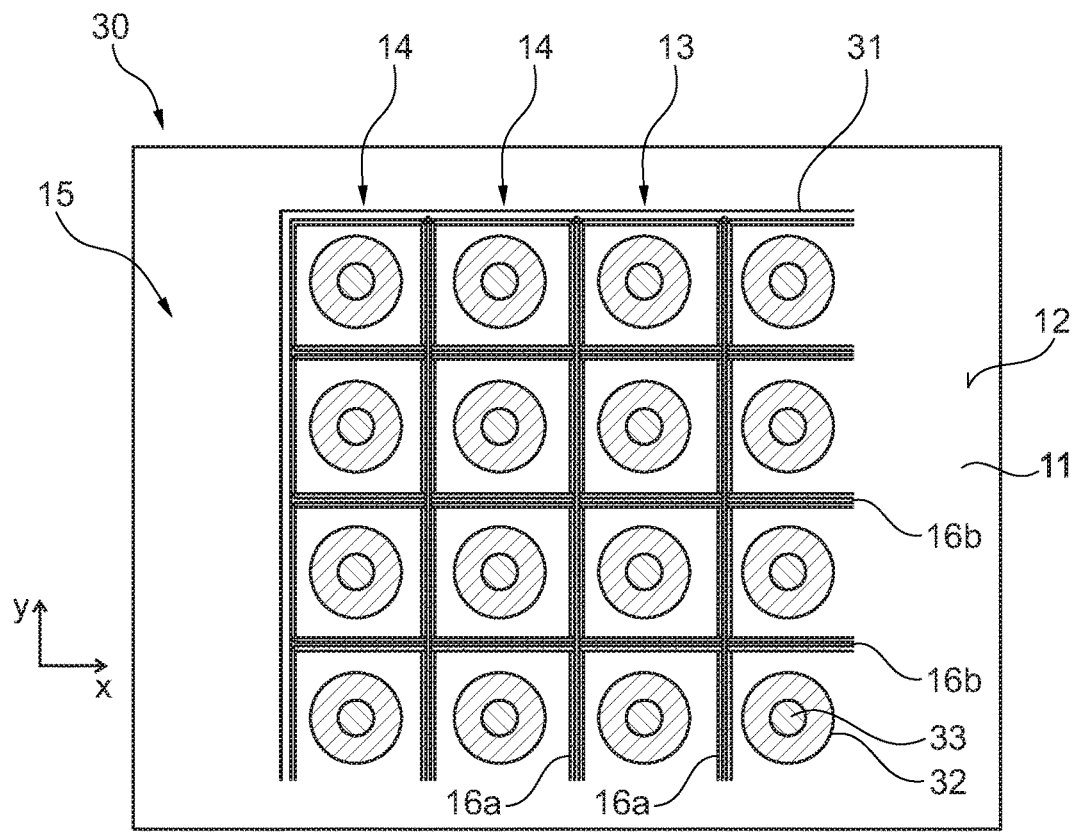
FIG. 2A illustrates a top view of a transistor device according to an embodiment.
Figure 2B:
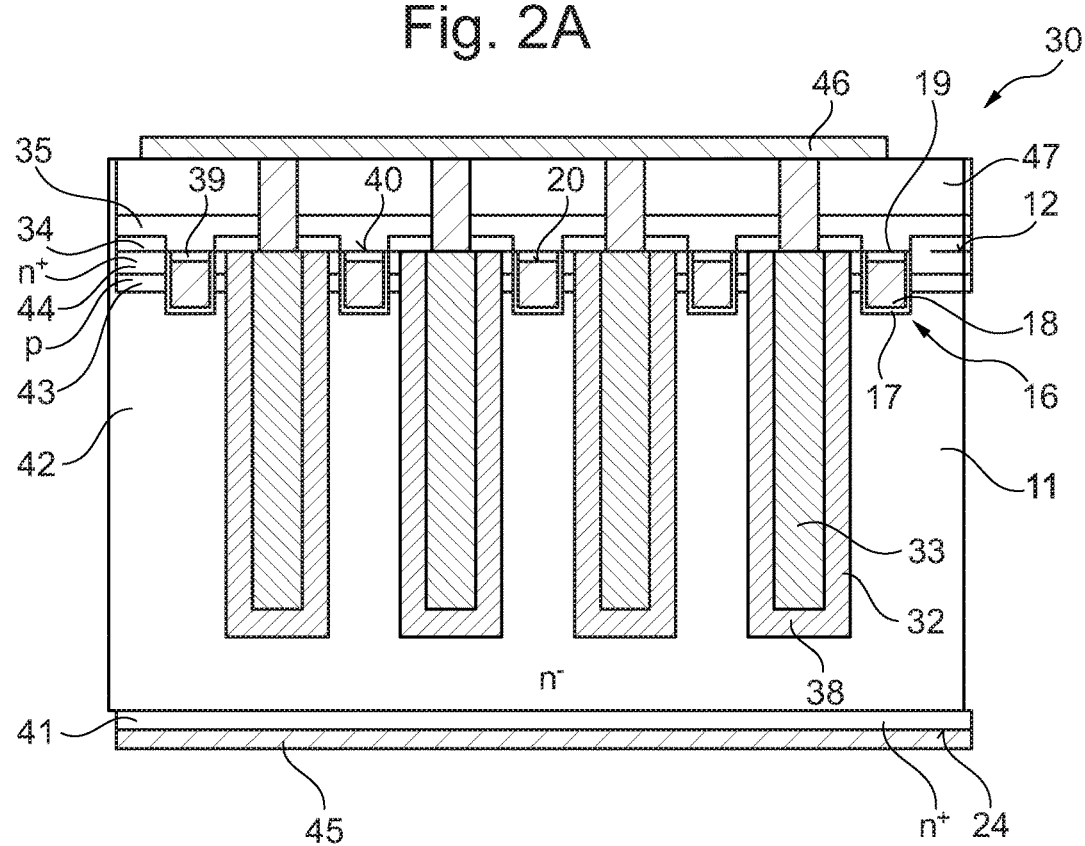
FIG. 2B illustrates a cross-sectional view of the transistor device of FIG. 2A.

FIG. 2A illustrates a top view of a transistor device 30 and FIG. 2B a cross-sectional view of the transistor device 30 including a gate trench 16 according to an embodiment.

The transistor device 30 includes a semiconductor substrate 11 having a main surface 12, a cell field 13 comprising a plurality of transistor cells 14 and an edge termination region 15 laterally surrounding the cell field 13 on all sides. The cell field 13 comprises the gate trench 16 in the main surface 12 of the semiconductor substrate 11, a gate dielectric 17 lining the gate trench 16, a metal gate electrode 18 arranged in the gate trench 16 on the gate dielectric 17 and an electrically insulating cap 19 arranged on the metal dielectric 18 and positioned within the gate trench 16.

As can be seen in the top view of FIG. 2A, the transistor device 30 the gate trench 16 has the form of a grid comprising longitudinal sections 16a extending in the y direction substantially parallel to one another and transverse sections 16b extending in the x direction and extending substantially parallel to one another.

The gate trenches 16 extend to a gate runner 31 positioned on the main surface 11 laterally adjacent the cell field 13. The gate runner 31 extends between the gate trenches 16a, 16b and substantially perpendicularly to the length of the gate trenches 16. The gate electrodes 18 positioned within the gate trench 16 also have an elongate shape and are each electrically connected to the gate runner 31.

The transistor device 30 further comprises a charge compensation structure. In some embodiments, such as that illustrated in FIGS. 2A through 2C, the charge compensation structure comprises a field plate 33 positioned in a field plate trench 32 that extends into the main surface 12 of the semiconductor substrate 11 and which is positioned laterally adjacent the gate trench 16. The field plate 32 is electrically conductive and may be formed of polysilicon, for example. The field plate 32 may be electrically isolated from the semiconductor substrate 11 with the field plate trench 33 being lined with an electrically insulating layer which is commonly known as a field oxide. The field oxide typically has a larger thickness than the gate dielectric 17.

Figure 2C:
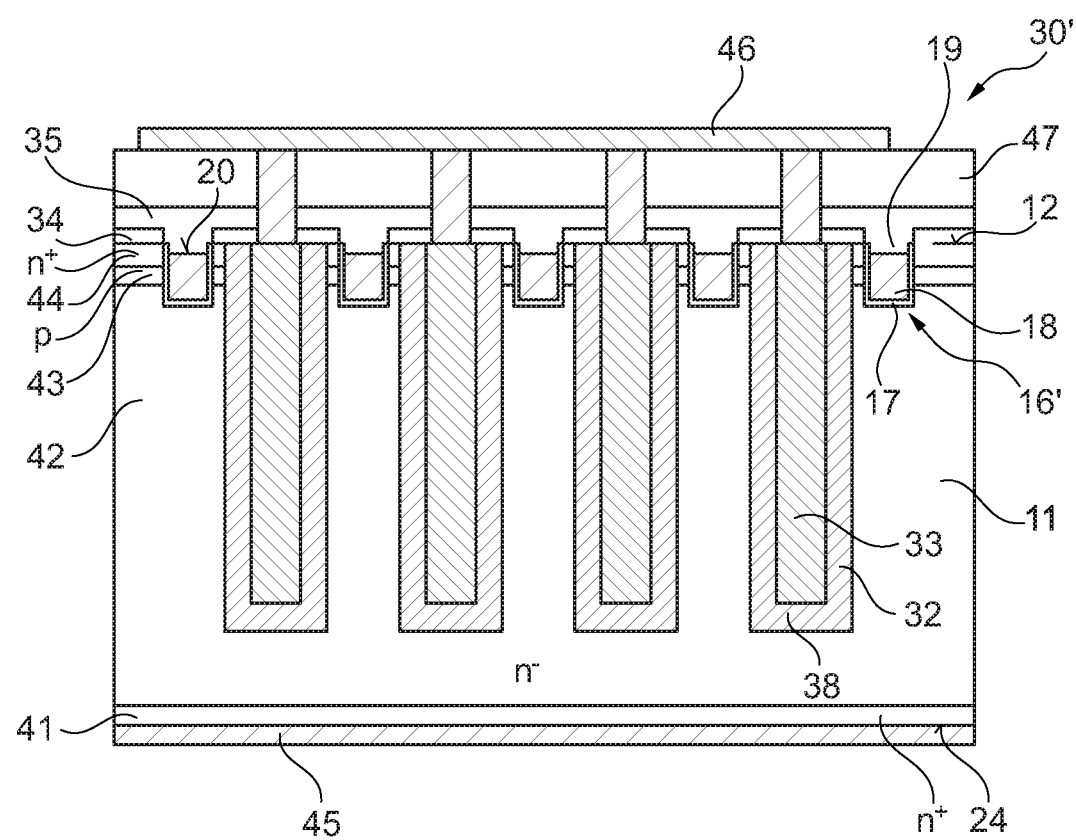
FIG. 2C illustrates a cross-sectional view of a transistor device according to an embodiment.

In some embodiments, such as that illustrated in FIGS. 2A through 2C, the charge compensation structure comprises a columnar field plate 33 positioned in a columnar field trench 32. The cell field 13 includes a plurality of field plate trenches 32 that are arranged in a regular array and extend into the semiconductor substrate 11 from the main surface 12. Each field plate trench 32 includes a columnar or needle-shaped field plate 33 that is electrically insulated from the semiconductor substrate 11 by an electrically insulating layer 38, or field plate oxide, which lines the base and side walls of the field plate trench 32. Each transistor cell can be considered to include a portion of the gate trench 16 and one columnar field plate trench 32.

Each columnar field plate 32 is positioned at the centre of a region of the main surface 12 that is bounded by two longitudinal trench sections 16a and two transverse trench sections 16b that form a square of the gate trench grid structure.

Referring to the cross-sectional view of FIG. 2B, the transistor device 30 further includes a first electrically insulating layer 34 which is arranged on the main surface 12 the semiconductor substrate 11 and laterally adjacent the gate trench 16, leaving the gate trench 16 and gate electrode 18 uncovered. The first electrically insulating layer 34 may serve as a scattering oxide for the subsequent body and source implants.

The gate trench 16 includes an electrically insulating cap 19 that is arranged on the metal gate electrode 18 and positioned within the gate trench 16. In some embodiments, such as that illustrated in FIG. 2B, the electrically insulating cap 19 comprises an upper dielectric layer 39 which is positioned in the gate trench 16 on top of the gate electrode 18. The upper dielectric layer 39 may have an upper surface 40 which is substantially coplanar with the upper surface 12 of the semiconductor substrate 11. The upper surface 20 of the gate electrode 18 is recessed within the trench 16 so that it is positioned at a distance from the main surface 12. This recess at the top of the gate trench 16 is filled with the upper dielectric layer 39.

A second insulating layer 35 extends continuously over the first insulating layer 34, which is positioned on the main surface 12 of the semiconductor substrate 11 laterally adjacent the gate trench 16, and over the upper dielectric layer 39 arranged in the gate trench 16.

The electrically insulating cap 19 be considered to include two layers; the upper dielectric layer 39 which is positioned within the gate trench 16 and which is in direct contact with the metal gate electrode 18 and the second insulating layer 35 which is positioned on the upper dielectric layer 39.

The side walls and base of the gate trench 16 are covered with an insulating layer in the form of the gate dielectric 17 which is typically thinner than the upper dielectric layer 39.

The transistor device 30 is vertical transistor device, in this embodiment a MOSFET device, with a drain region 41 that is highly doped with the first conductivity type at a second main surface 24 which opposes the main surface 12. The semiconductor substrate 11 may form the drift region 42 of the transistor device 30 and is lightly doped with the first conductivity type, e.g. n-type. A body region 43 is positioned on the drift region 42 and the comprises dopants of a second conductivity type, e.g. p-type, which opposes first conductivity type. A source region 44 is positioned on or in the body region 43 and comprises dopants of a first conductivity type.

A metallic layer 45 is positioned on the drain region 41 to form a drain contact for the transistor device 30 on the rear surface. A conductive layer 46 is positioned on the main surface 12 of the semiconductor substrate 11 on the cell field 13. The conductive layer 46 is electrically coupled to the source region 44 and the field plates 33 and forms a source contact for the transistor device 30. One or more insulating layers 47 are positioned between the conductive layer 46 and the second dielectric layer 35. The metal gate electrodes 18 may be coupled to a gate contact for the transistor device 30.

Whilst the columnar field plate trenches 32 and columnar field plates 33 are illustrated in plan view as circular, the columnar field plate trenches 32 and field plates 33 are not limited to this shape may have other shapes, for example hexagonal or square.

In other non-illustrated embodiments, the field plate 33 and the field plate 32 trench are elongate and have a stripe-like shape and the gate trench has an elongate stripe-like shape. The length of the field plate trench 32 and field plate 33 extends substantially parallel to the length of the elongate gate trench 16 and the elongate metal gate electrode 18.

The electrically insulating cap 19 may have other structures. In some embodiments, such as that illustrated in FIG. 2C, the electrically insulating cap 19 is formed from a portion of the second insulating layer 35 that extends over the first insulating layer 34 and over the metal gate electrode 18 positioned within the gate trench 16. In this embodiment, the gate electrode 18 is recessed within the gate trench 16 so that its upper surface 20 is spaced at a distance from the main surface 12 and is positioned within the gate trench 16. The second insulating layer 35 extends into the upper portion of the gate trench 16 and is in direct contact with an upper surface 20 of the metal gate electrode 18 that is positioned within the gate trench 16.

In the embodiment illustrated in FIG. 2C, the electrically insulating cap 19 is formed by a portion of the second electrically insulating layer 35 only. The side walls and base of the gate trench 16 are covered with an insulating layer in the form of the gate dielectric 17. The gate dielectric 17 and the portion of the electrically insulating layer 35 forming the cap 19 form an encapsulation for the metal gate electrode.

Figure 3:
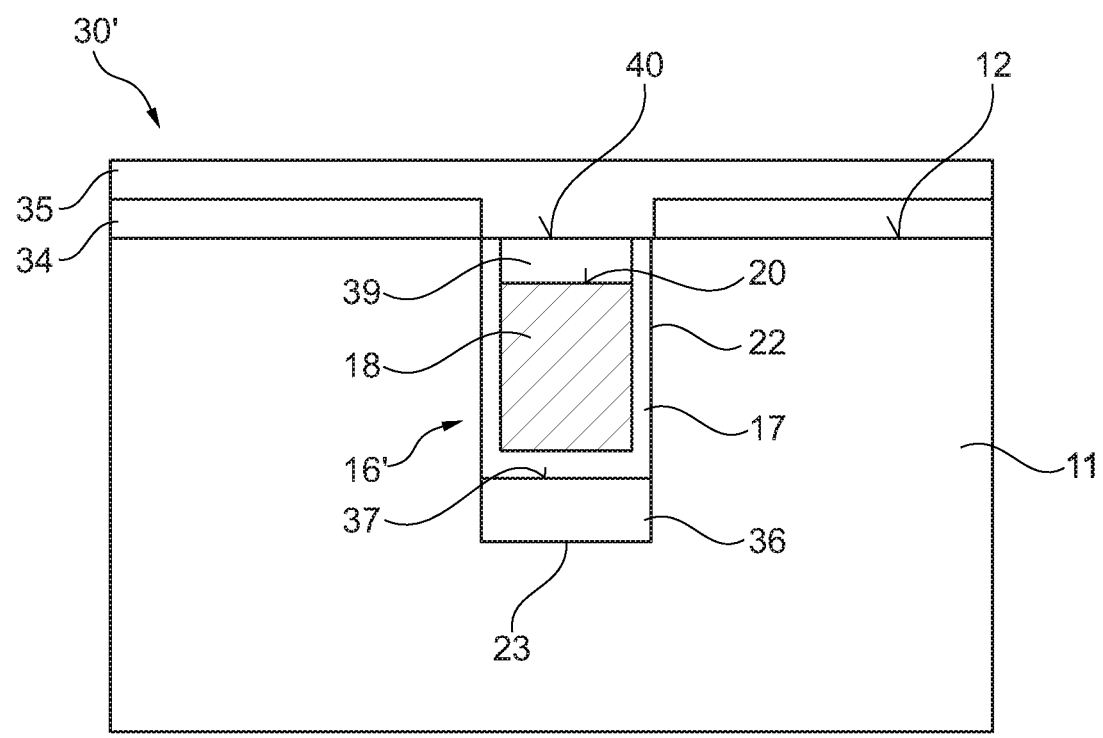
FIG. 3 illustrates a cross-sectional view of a transistor device including a gate trench according to an embodiment.

Referring to FIG. 3, in some embodiments, the transistor device 30' includes a gate trench 16' in which the gate dielectric 17 further includes a lower dielectric layer 36 which is positioned at the base 23 of the gate trench 16. The gate dielectric 17 lines the sidewalls 22 of the gate trench 16 and may also be positioned on an upper surface 37 of the lower dielectric layer 36. The gate dielectric 17 therefore has a greater width at the base 23 of the trench than at the sidewalls 22 of the trench 16.

In some embodiments, such as that illustrated in FIG. 3, the electrically insulating cap 19 comprises an upper dielectric layer 39 having an upper surface 40 which is substantially coplanar with the upper surface 12 of the semiconductor substrate 11. In this arrangement, the transistor device 30 may include a first insulating layer 34 which is formed on the main surface 12 of the semiconductor substrate 11 laterally adjacent to the gate trench 16 and which leaves the upper dielectric layer 39 uncovered and a second dielectric layer 35 which is positioned on the first electrically insulating layer 34 and which extends over the main surface 12 of the substrate 11 and over the upper dielectric layer 39 positioned within the gate trench 16.

In contrast to the embodiment illustrated in FIG. 2C, the electrically insulating cap 19 be considered to include two layers; the upper dielectric layer 39 which is positioned within the gate trench 16 and the second insulating layer 35 which is positioned on the upper dielectric layer 39.

In some embodiments, the gate dielectric layer 17 which lines the sidewalls 22 and either the base 23 of the trench 16 or the upper surface 37 of an additional lower dielectric layer 36 is a deposited layer rather than being formed by thermal oxidation of the material of the semiconductor substrate. In some embodiments, the gate dielectric 17 is a deposited silicon oxide layer.

A gate dielectric 17 which is formed by deposition can be distinguished from a gate dielectric 17 that is formed by thermal oxidation by an increased uniformity in the thickness of the gate dielectric on the side walls of the trench. The gate dielectric 17 may be formed using a TEOS deposition process. In some embodiments, a further densification of the deposited gate dielectric is carried out, for example by use of a subsequent annealing step.

A combination of a metal gate electrode 18 and a deposited gate dielectric 17 is found to enable fast switching and results in lower losses which are thought to be the result of a reduction in the gate charge and gate resistance.

In embodiments including a lower dielectric layer 36, the lower dielectric layer 36 may be deposited using a high density plasma (HDP) process.

In embodiments including an upper dielectric layer 39, the upper dielectric layer 39 may comprise a TEOS deposited layer.

In some embodiments, the liner layer of the metal gate electrode 18 is a deposited layer. The liner layer may comprise titanium, Ti, and/or titanium nitride, TiN, and the filler material may comprise of tungsten, W.

In an embodiment, the gate dielectric is a TEOS layer, the liner layer is formed of titanium nitride, TiN, and the filler material is formed of tungsten, W.

The method of fabricating a gate of a transistor device will now be described with reference to FIGS. 4A to 4G.

In the following, the process sequence for the gate module is described and illustrated for a silicon power MOSFET using charge-compensation by field-plates in columnar field plate trenches, which are illustrated as separate circular needle trenches. However, this sequence is not limited to needle trenches, for example stripe-like field plate trenches could be used.

The process is compatible with very high aspect ratios of the trenches, i.e. 3 and higher. The aspect ratio is defined as depth/width. After the gate oxide module, the aspect ratio is even higher, in our case up to 10, however the techniques described herein could be used for even higher aspect ratios.

Figure 4A:
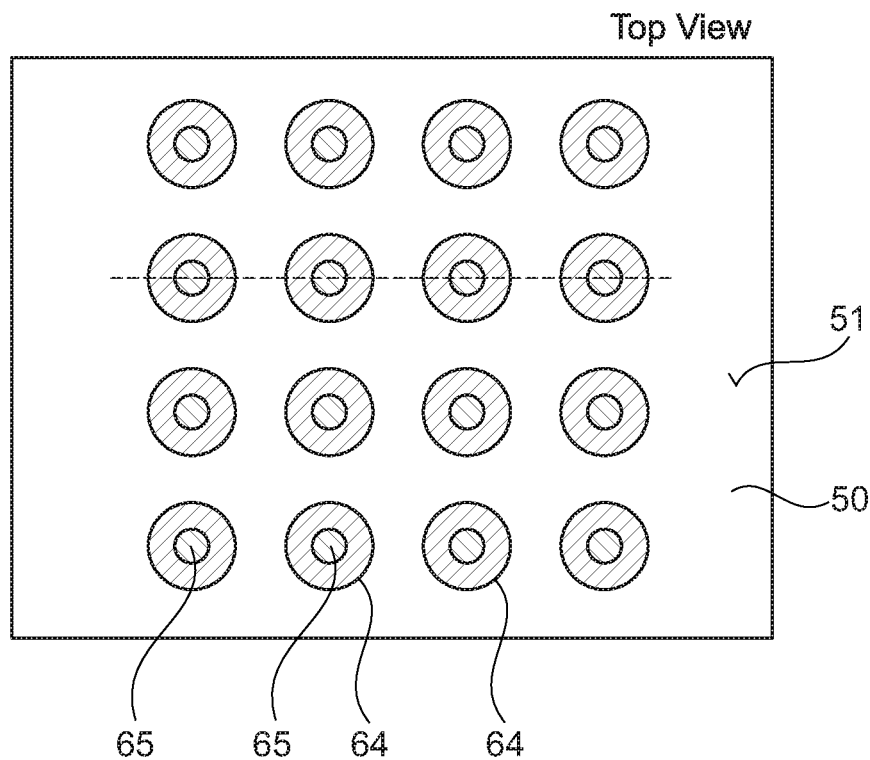
FIGS. 4A to 4I illustrate a method of fabricating a gate of a transistor device.
Figure 4B:
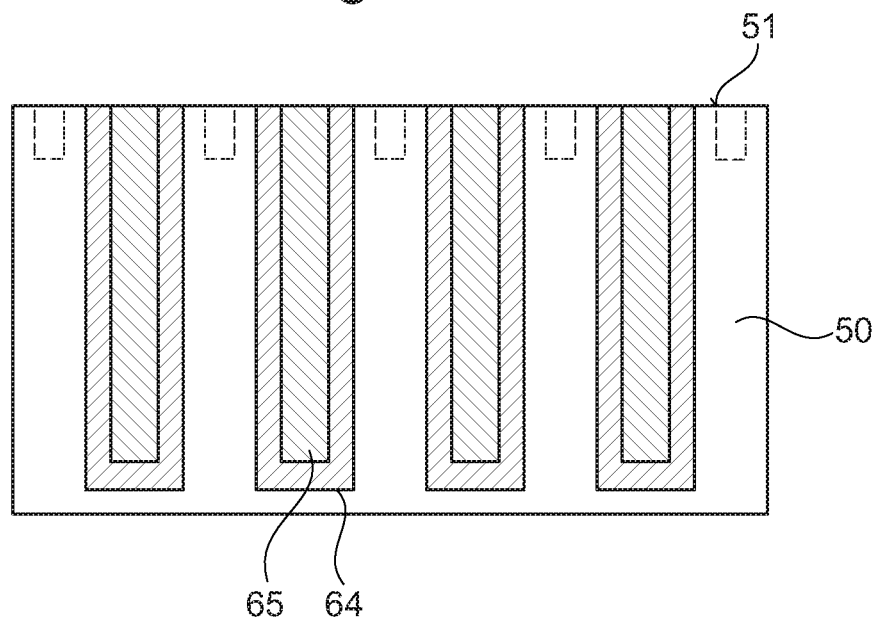

Referring to the top view of FIG. 4A and the cross-sectional view of FIG. 4B, the starting point is a semiconductor substrate 50 having a main surface 51 into which deep field plate trenches 64 with the field-plates 65 have already been produced. However, the body and source region of the transistor structure have not yet been formed. The semiconductor substrate 50 may be formed of monocrystalline silicon or an epitaxial silicon layer, for example. The columnar field plate trenches are illustrated as being circular in plan view. The columnar field plate trenches may however have other forms in plan view, for example, square or hexagonal. The later position of the gate trench is indicated in FIG. 4B with dotted lines.

In FIGS. 4C to 4I, only the region of the semiconductor substrate 50 including the gate trench is illustrated.

Figure 4C:
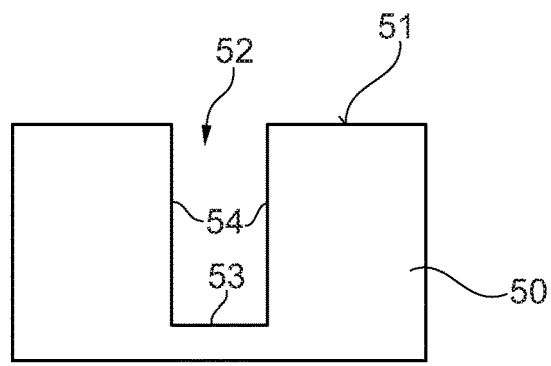

Referring to FIG. 4C, the gate trench is formed in an area of the main surface 51 positioned between two rows of field plate trenches.

A gate trench 52 is formed in the main surface 51 which includes a base 53 and sidewalls 54 which extend substantially perpendicularly to the main surface 51. The gate trench 52 may have an elongate strip like structure with its length extending into the plane of the drawing.

Figure 4D:
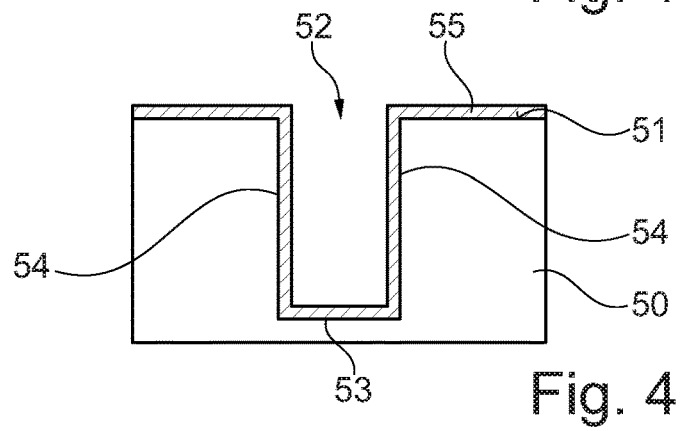

Referring to FIG. 4D, a gate dielectric 55 is formed on the main surface 51 of the semiconductor substrate 50 and on the sidewalls 54 and base 53 of the trench 52. The gate dielectric 55 may be a silicon oxide layer which may be formed by deposition of a silicon oxide layer on the main surface 51 of the semiconductor substrate 50 as well as on the base 53 and sidewalls 54 of the gate trench 52. The gate dielectric 55 may be deposited using a TEOS process and be subsequently subjected to a densification process, for example annealing process.

Figure 4E:
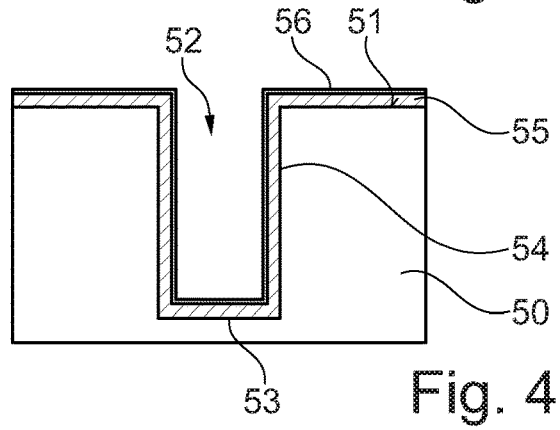
Figure 4F:
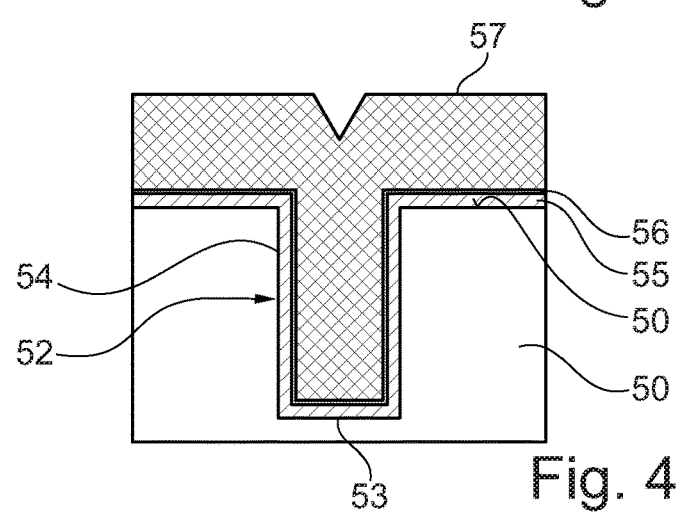

Referring to FIGS. 4E and 4F, a metal gate electrode 59 is then formed on the gate dielectric 55. The metal gate electrode 59 is formed by forming one or more liner layers 56 on the gate dielectric 55 and by forming a filler material 57 on the liner layer 56.

The liner layer 56 may include titanium, for example titanium nitride, and some embodiments may include two or more sublayers, for example titanium and titanium nitride. The filler material 57 may be formed of tungsten and may entirely fill the gap in the gate trench 52 which is lined by the liner layer 56 and the gate dielectric 55. The liner layer 56 and the filler material 57 also extends over the major surface 51 of the semiconductor substrate 50 laterally adjacent to the gate trench 52.

The liner layer 56 may be formed by pulsed chemical vapour deposition (pCVD) or atomic layer deposition (ALD). The filler material 57 may be formed by a process enabling conformal deposition, for example metal organic chemical vapour deposition (MOCVD) and may be subjected to a subsequent annealing process.

Figure 4G:
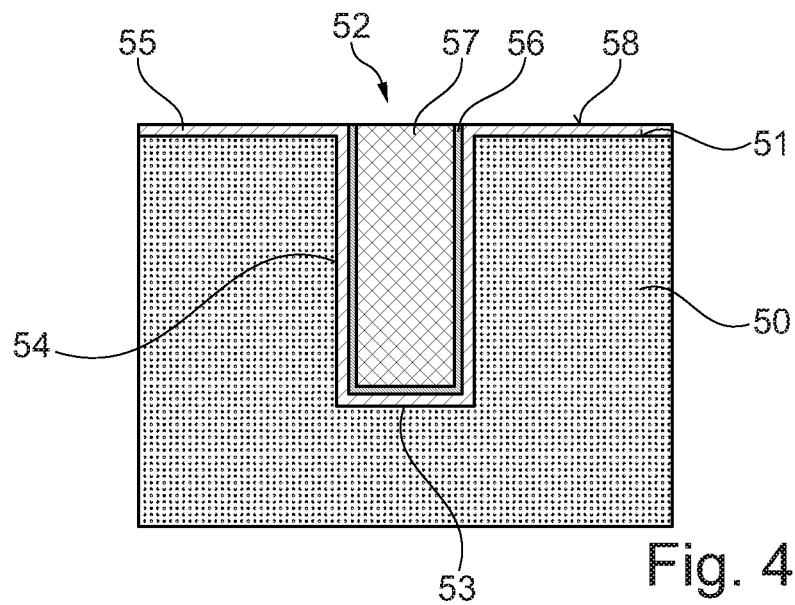

Referring to FIG. 4G, a planarization process may be carried out to produce a planarized surface 58 formed by the gate dielectric layer 55 positioned on the main surface 51 of the semiconductor substrate 50 and the filler material 57 positioned in the gate trench 52. The portion of the liner layer 56 arranged on the major surface 51 adjacent to the gate trench 52 is removed.

Figure 4H:
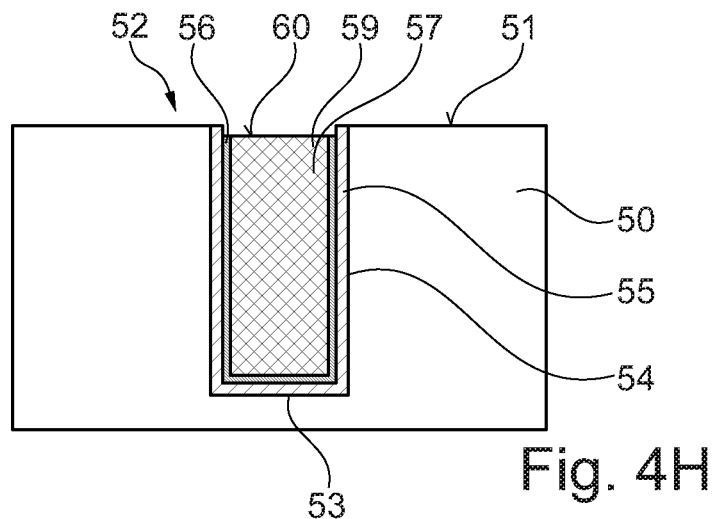

Referring to FIG. 4H, a portion of the filler material 57 and liner layer 56 are removed from the upper portion of the gate trench 52 such that the metal gate electrode 59 has an upper surface 60 which is recessed within the trench 52 and is positioned at a distance from the main surface 51 of the substrate 50. In this embodiment, upper surface 60 of the metal gate electrode 59 may be approximately coplanar with the main surface 51 or recessed within the gate trench 52 by a small distance.

Figure 4I:
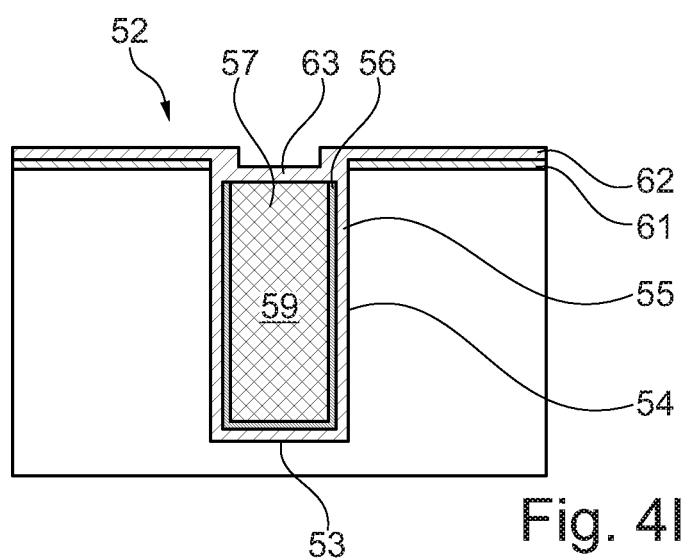

Referring to FIG. 4I, a first electrically insulating layer 61 is formed on the main surface 51 of the semiconductor substrate 50. The first electrically insulating layer 61 may be selectively formed on the semiconductor substrate 50. In some embodiments, the first electrically insulating layer may extend onto the gate dielectric 55 lining the gate trench 52. The metal gate electrode 59 remains uncovered by the first electrically insulating layer 61. The first electrically insulating layer 61 may serve as a scattering layer during the subsequent implant of the body region and source region.

A second insulating layer 62 is then formed which extends over the first electrically insulating layer 61 and over the upper surface 60 of the metal gate electrode 59. The portion of the second insulating layer 62 which is positioned directly on the metal gate electrode 59 forms an electrically insulating cap 63 for the metal gate electrode 59. At positions within the active region of the transistor device, the metal gate electrode 59 is completely encapsulated by the dielectric material of the gate dielectric 55 and electrically insulating cap 63.

At this stage in the method, the metal gate electrode 59 is completely encapsulated by the dielectric material of the gate dielectric and the electrically insulating cap 63 at all regions of the transistor device. In a later stage, at least one opening in the encapsulation is formed to allow a contact to the metal gate electrode to be formed. The opening may be positioned in the edge termination region.

FIGS. 5A to 5I illustrate a method of fabricating a gate of a transistor device according to an embodiment.

Figure 5A:
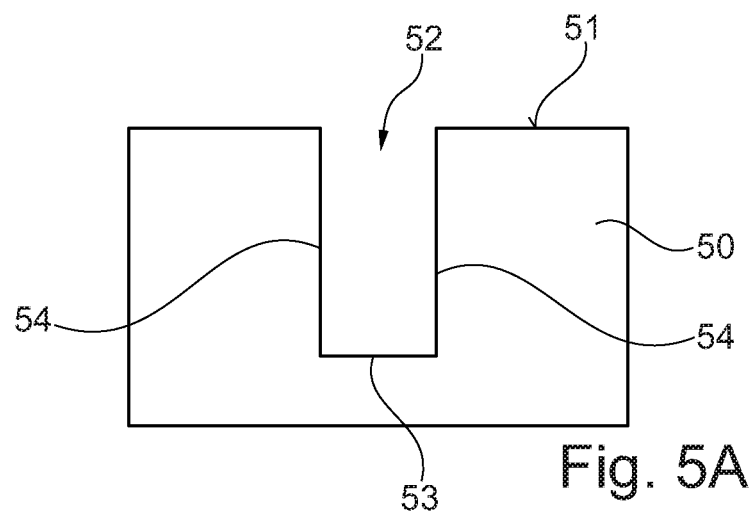
FIGS. 5A to 5I illustrate a method of fabricating a gate of a transistor device according to an embodiment.

Referring to FIG. 5A, a semiconductor substrate 50 having a main surface 51 and gate trench 52 formed in the main surface 51 is provided. The gate trench 52 includes a base 53 and sidewalls 54 which extend substantially perpendicularly to the main surface 51. The gate trench 52 has an elongate form having a length extending into the plane of the drawing. As in the embodiments described with reference to FIGS. 4A through 4I, the semiconductor substrate 50 may also include a charge compensation structure including field plates 65 positioned in field plate trenches 64 which are not seen in the portions of the semiconductor substrate shown in FIGS. 5A through 5I. The field plates 65 and field plate trenches 64 may be elongate or columnar.

Figure 5B:
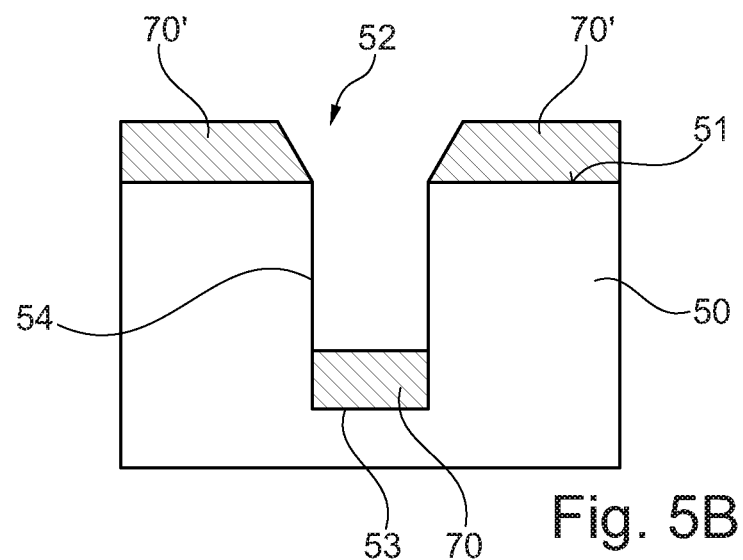

Referring to FIG. 5B, a lower dielectric layer 70 is formed on the base 53 of the gate trench 52. This dielectric layer 70 also has portions 70' which are formed on the main surface 51 of the substrate 50 laterally adjacent the trench 52. The lower dielectric layer 70 and the portions 70' may be deposited with a greater thickness on the lateral or horizontal surfaces than on the vertical surfaces such as the side walls 54 of the gate trench 52 using HDP, for example. In a subsequent process, the portions deposited on the vertical surfaces may be removed, for example by use of a wet or dry chemical etching process.

Figure 5C:
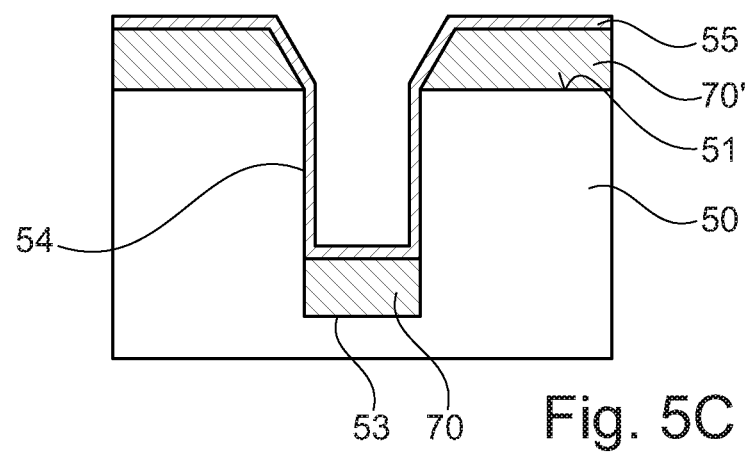

Referring to FIG. 5C, a gate dielectric layer 55 is then formed which extends over the dielectric layer 70', the sidewalls 54 of the trench 52 and the lower dielectric layer 70 arranged at the base 53 of the gate trench 52. The gate dielectric layer 55 may be deposited, for example using TEOS. In this embodiment, a thicker gate dielectric is provided at the base 53 of the gate trench 52 by a combination of the lower dielectric layer 70 and the deposited gate dielectric layer 55. This increased thickness at the base 53 of the gate trench 52 may be used to further reduce the gate charge and gate drain charge.

Figure 5D:
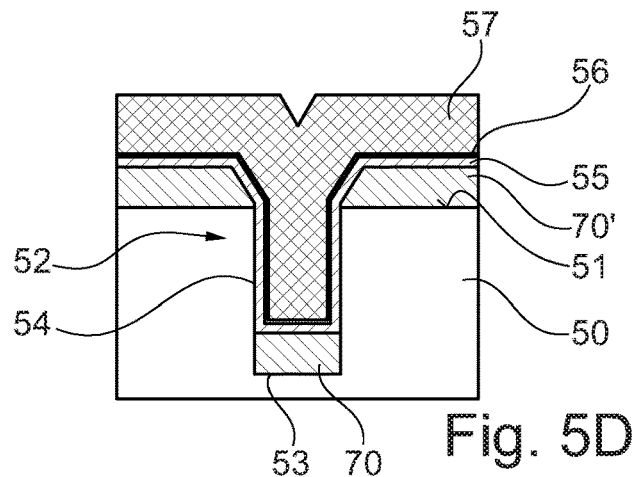

Referring to FIG. 5D, a metal gate electrode 59 is then formed in the gate trench 52 by forming a liner layer 56 on the gate dielectric layer 55 and over the main surface 51 of the semiconductor substrate 50, the sidewalls 54 and base 53 of the trench 52. Filler material 57 is then deposited which fills the gap formed in the gate trench 52 by the liner layer 56 and the gate dielectric 55. The filler material 57 is also positioned on the major surface 51 of the semiconductor substrate 50 in regions laterally adjacent to the gate trench 52. The filler material 57 may be deposited conformally and have a thickness such that any indentation above the gate trench 52 that is caused by conformal deposition of the filler material 57 is positioned above the plane of the liner layer 56 arranged on the main surface 51.

The liner layer 56 may be formed by pulsed chemical vapour deposition (pCVD) or atomic layer deposition (ALD). The filler material 57 may be formed by a process enabling conformal deposition, for example metal organic chemical vapour deposition (MOCVD) and may be subjected to a subsequent annealing process.

Figure 5E:
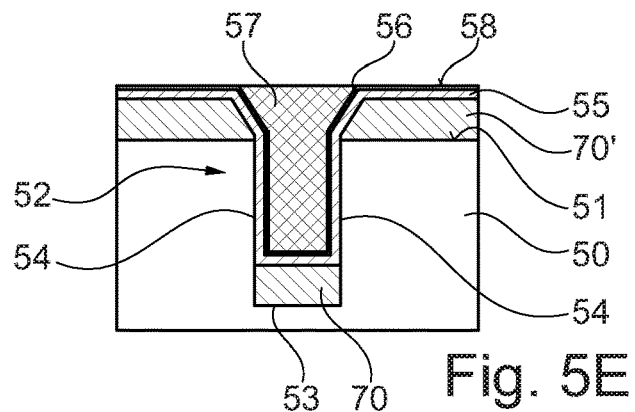

Referring to FIG. 5E, a planarization process is carried out to remove the filler material 57 and liner layer 56 positioned on the main surface 51 and laterally adjacent the gate trench 52 to provide to form a planarized surface 58 comprising the regions of the dielectric layer 55 positioned on the dielectric layer 70' and the filler material 57.

Figure 5F:
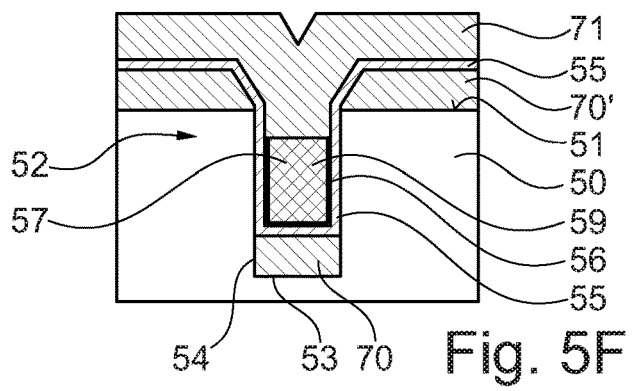

The filler material 57 and liner layer 56 are then removed from the gate trench 52 such that a metal gate electrode 59 is formed having an upper surface 60 positioned at a depth from the main surface 51 of the semiconductor substrate 50 and within the gate trench 52, as can be seen in FIG. 5F. The metallic material of the gate electrode 59 is selectively removed such that the gate dielectric layer 55 remains positioned on the dielectric layer 70' and side walls 54 of the gate trench 52. The depth of the upper surface 60 of the gate electrode 59 from the main surface is larger than in the embodiment described with reference to FIGS. 4A through 4I.

Referring to FIG. 5F, in this embodiment, a further electrically insulating layer 71 is formed which fills the upper portion of the gate trench 52 and which extends over the gate dielectric 55 positioned adjacent the gate trench 52. The further electrically insulating layer 71 may be deposited using TEOS or a plasma based technique, such as HDP.

Figure 5G:
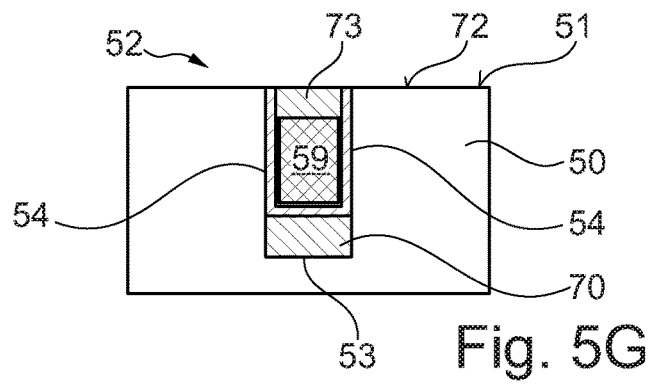

Referring to FIG. 5G, a further planarization process is carried out to remove the dielectric material 71, the gate dielectric 55 and the dielectric material 70' and form a planarized surface 72 which is formed from the material of the semiconductor substrate 50 and the remainder of the electrically insulating layer 71 that is positioned in the upper portion of the gate trench 52 above the metal gate electrode 59. The remainder of the electrically insulating layer 71 forms an upper dielectric layer 73 positioned on the upper surface 60 of the gate electrode 59 and within the gate trench 52. The upper dielectric layer 73 extends laterally within the gate trench 52 between the gate dielectric 55 positioned on the side walls 54.

Figure 5H:
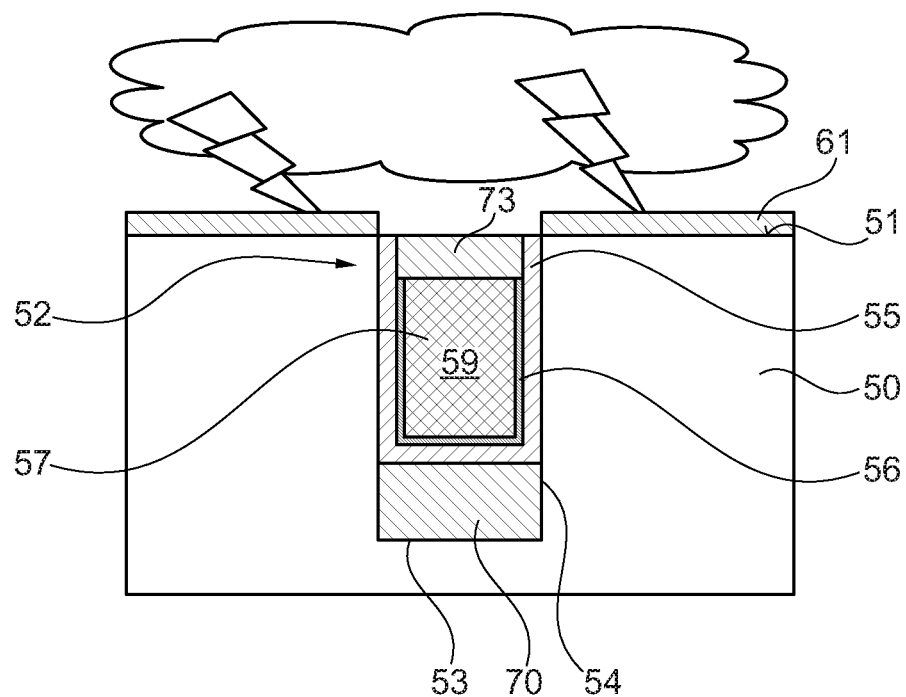

Referring to FIG. 5H, the first electrically insulating layer 61 is then formed on the main surface 51 of the semiconductor substrate 50. The first electrically insulating layer 61 may be selectively formed on the main surface 51 by selective oxidation of the semiconductor material of the substrate 50. In some embodiments, the first electrically insulating layer 61 also extends over the gate dielectric layer 55 lining the gate trench 52 but leaves the upper dielectric layer 73 uncovered.

Figure 5I:
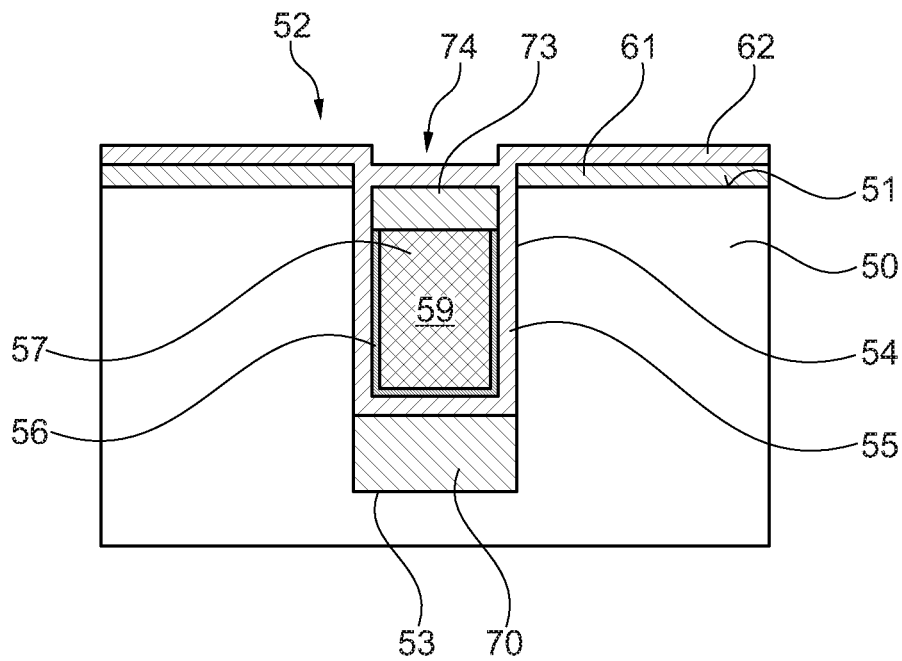

Referring to FIG. 5I, the second electrically insulating layer 62 is then formed on the first electrically insulating layer 61 and on the upper dielectric layer 73 in the gate trench 52 as a single continuous layer. The second electrically insulating layer 62 may be formed by a TEOS process. In some embodiments, the first electrically insulating layer 61 is omitted and only the second electrically insulating layer 62 is applied.

The metallic gate electrode 59 is therefore electrically insulated on its top surface by a combination of the upper dielectric layer 73 and the second insulating layer 62 forming an electrically insulating cap 74, on its bottom surface by the lower dielectric layer 70 and gate dielectric 55 and its side faces by the gate dielectric 55 positioned on the sidewalls 54 of the gate trench 52.

The electrically insulating cap 74 also results in a planar surface 72 on which the subsequent metallization structure with its interlayer dielectrics can be built up. The interlayer dielectric layers, commonly formed from undoped silicon glass (USG) and/or BPSG (borophosphosilicate glass), are however, not in direct contact with the metal gate electrode 59 in the gate trench 52 positioned in the cell field due to the presence of the intervening electrically insulating cap 74 positioned in the gate trench 52 on top of the metal gate electrode 59.

Figure 6A:
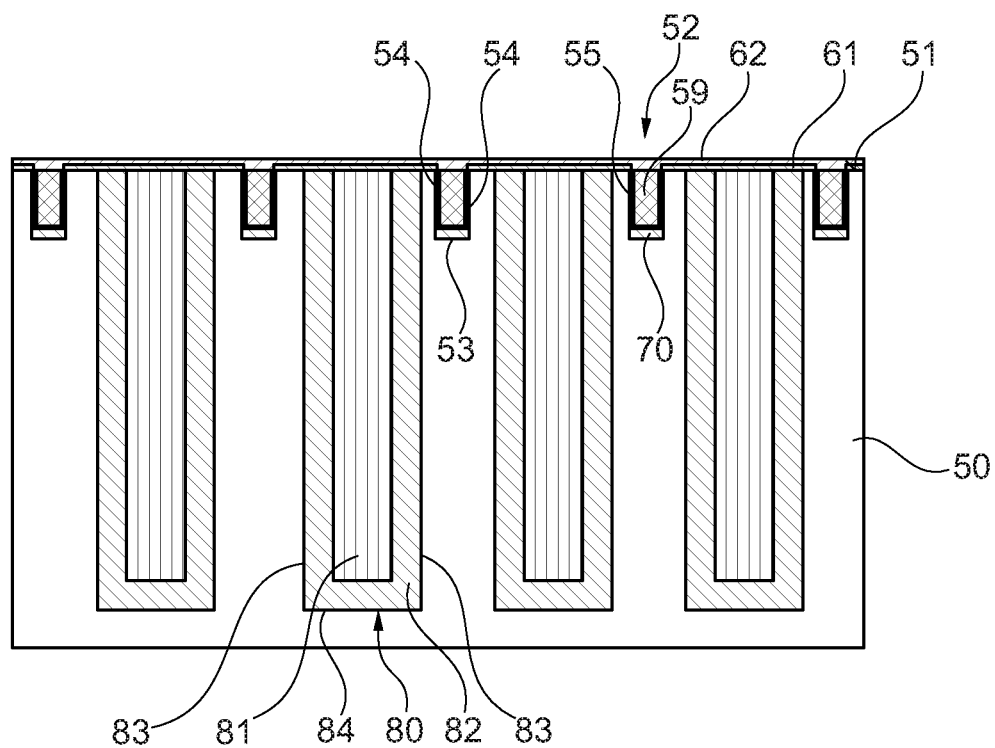
FIGS. 6A and 6B illustrate a method of fabricating a transistor device including the gate trench of one of the embodiments described herein.
Figure 6B:
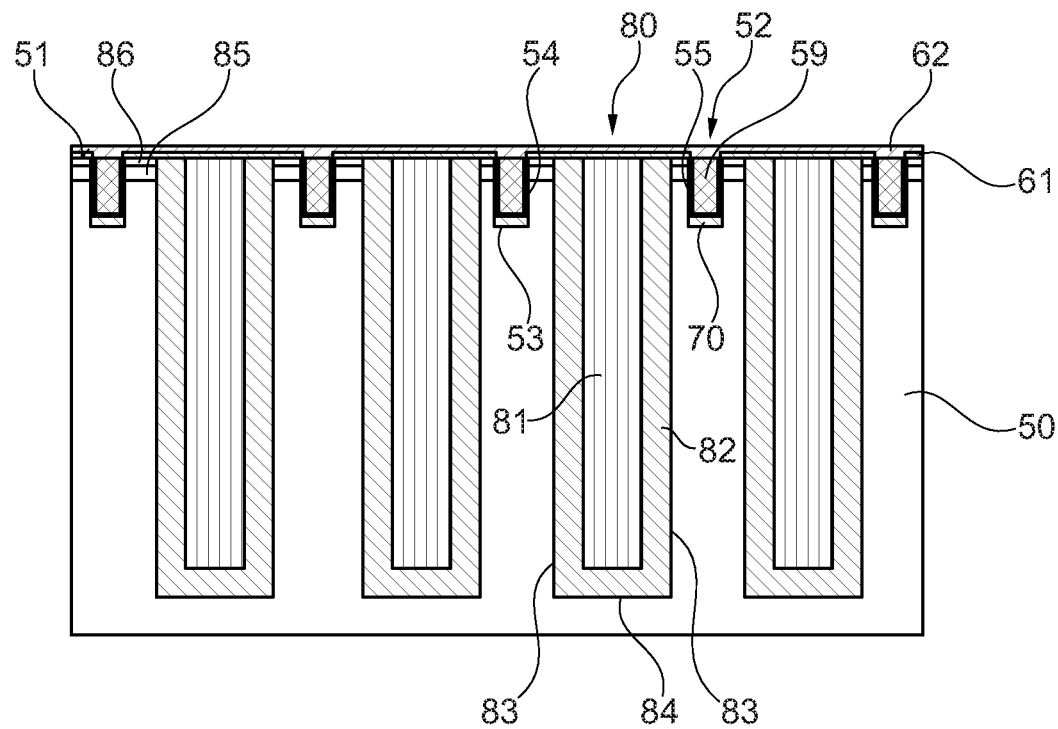

FIGS. 6A and 6B illustrate cross-sectional views of a transistor device which may include a gate structure according to any one of the embodiments described herein. FIGS. 6A and 6B illustrate a charge compensation structure in the form of a field plate trench 80 which includes a field plate 81 which is electrically insulated from the semiconductor substrate 52 by an electrically insulating layer 82. The electrically insulating layer 82 is commonly known as field plate oxide and lines the sidewalls 83 and base 84 of the field plate trench 80. In some embodiments, the field plate trench 80 may have an elongate strip like structure having a length which extends substantially parallel to the length of the gate trenches 52. In other embodiments, the field plate trench 80 may have a columnar form and a plurality of field plate trenches columnar field plate trenches are provided which are arranged in a regular array of rows and columns. An elongate gate trench may be positioned between two rows of columnar field plate trenches.

In the embodiment illustrated in FIG. 6A, the gate trench 52 includes a lower dielectric layer 70 positioned at its base 53, a gate dielectric 55 positioned on the lower dielectric layer 70 and sidewalls 54 of the gate trench 52. The metal gate electrode 59 positioned within the trench is electrically isolated at its top side by the second dielectric layer 62 which extends over the main surface 51 of the semiconductor substrate 50 and into the gate trench 52 where it is in direct contact with the upper surface 60 of the metal gate electrode 59.

In the embodiment illustrated in FIGS. 6A and 6B, the metal gate electrode 59 is encapsulated by the lower dielectric layer 70 and gate dielectric 55 on its lower side, by the gate dielectric 55 on its side faces and by the second dielectric layer 62 at its upper side.

In other embodiments, the gate trench 52 may have an arrangement in which the metal gate electrode 59 is encapsulated by only the gate dielectric 55 on its lower side and on its side faces and by only the second dielectric layer 62 at its upper side.

In other embodiments, the metal gate electrode 59 is encapsulated by the lower dielectric layer 70 and the gate dielectric 55 on its lower side, by the gate dielectric 55 on its side faces and at its upper side by an additional upper dielectric layer positioned within the gate trench 52 and the second dielectric layer 62 positioned on the additional upper dielectric layer.

The first dielectric layer 61 is also provided which also extends over main surface 51 of the semiconductor substrate 50 such that the second dielectric layer 62 is positioned on this first dielectric layer 61 in regions laterally adjacent the metal gate electrode 59.

The field plate trenches and the field plates 81 may be formed in the main surface 51 before fabrication of the gate electrode 55.

The electrically insulating cap, which is provided by the second insulating layer 62 positioned on the metal gate electrode 59 and, if present, the additional upper dielectric layer 73, serves to protect the underlying metal gate electrode 59 during subsequent processing.

Referring to FIG. 6B, implantation of dopants of the second conductivity type into the main surface 51 to form the body region 85 and implantation of dopants of the first conductivity type to form source region 86 on the body region 85 is performed after fabrication of the gate electrode 59 in the gate trench 52.

A metallisation structure may then be formed on the main surface 51 to provide electrical connection to the source region 86 and field plates 83 at positions within the cell field 13 and a connection to the metal gate electrodes 59 at a position outside of the cell field 13.

Figure 7:
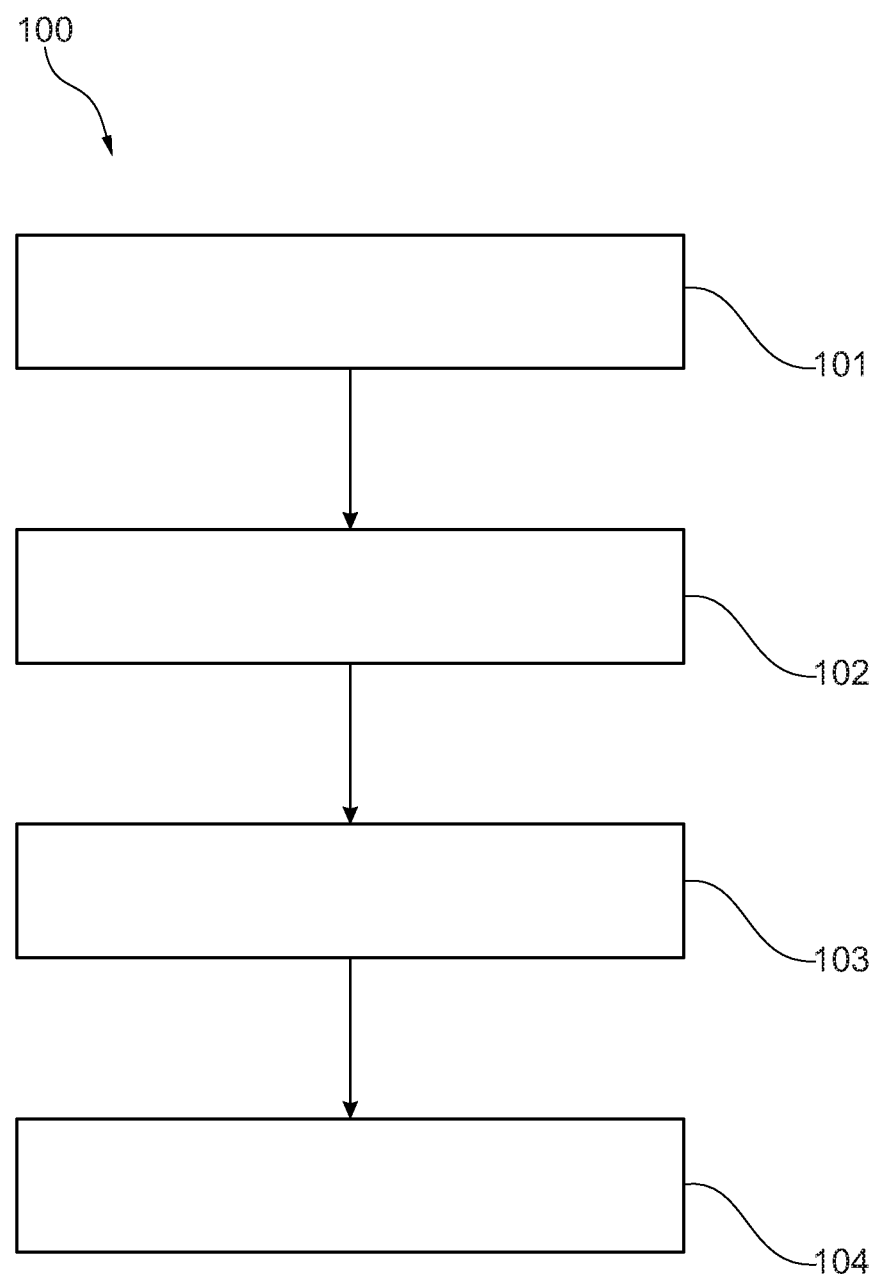
FIG. 7 illustrates a flowchart of fabricating a gate of a transistor device.

FIG. 7 illustrates a flowchart 100 of fabricating a gate of a transistor device. The transistor device comprises a semiconductor substrate having a main surface, a cell field comprising a plurality of transistor cells and an edge termination region laterally surrounding the cell field.

In block 101, a gate trench is formed in the main surface of the semiconductor substrate in the cell field. In block 102, the gate trench is lined with a gate dielectric. In block 103, a metal gate electrode is formed on the gate dielectric and within the gate trench. In block 104, an electrically insulating cap is formed on the metal gate electrode and within the gate trench.

A gate structure is provided in which the metal gate electrode is encapsulated by a gate dielectric on all sides in regions of the metal gate electrode positioned in the active area of the device, i.e. in the cell field. Thus, the fabrication of a transistor device including a metal gate electrode is simplified as standard wet chemical cleaning techniques can be used in the subsequent process steps during the manufacturing of the device. Therefore, this structure provides a way of overcoming many of the restrictions for the manufacturing of a metal gate device. Furthermore, the top of the gate electrode is not exposed to increased electrical fields, which can lead to an increased lifetime of the device.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
a semiconductor substrate having a main surface, a cell field comprising a plurality of transistor cells of a vertical power transistor, a drain region of a first conductivity type at a second main surface which opposes the main surface, and an edge termination region laterally surrounding the cell field;
wherein the cell field comprises:
  a body region of a second conductivity type which opposes the first conductivity type on a drift region of the first conductivity type;
  a source region of the first conductivity type on or in the body region;
  a gate trench in the main surface of the semiconductor substrate;
  a gate dielectric lining the gate trench;
  a metal gate electrode arranged in the gate trench on the gate dielectric; and
  an electrically insulating cap arranged on the metal gate electrode and within the gate trench.

2. The transistor device of claim 1, further comprising a first electrically insulating layer arranged on the main surface of the semiconductor substrate laterally adjacent the gate trench.

3. The transistor device of claim 2, wherein the electrically insulating cap forms part of a second electrically insulating layer that extends over the first electrically insulating layer and over the metal gate electrode positioned within the gate trench.

4. The transistor device of claim 1, wherein the gate dielectric further comprises a lower dielectric layer arranged at a base of the gate trench, and wherein the gate dielectric lines side walls of the gate trench and is positioned on an upper surface of the lower dielectric layer.

5. The transistor device of claim 4, wherein the electrically insulating cap comprises an upper dielectric layer having an upper surface that is substantially coplanar with the main surface of the semiconductor substrate.

6. The transistor device of claim 5, further comprising a second electrically insulating layer that extends over the main surface of the semiconductor substrate and over the upper dielectric layer.

7. The transistor device of claim 1, further comprising a charge compensation structure, wherein the charge compensation structure comprises a columnar field plate in a columnar field plate trench that extends into the main surface and is positioned laterally adjacent the gate trench.

8. The transistor device of claim 1, wherein both the body region and the source region are in direct contact with the gate dielectric.

9. The transistor device of claim 1, wherein the semiconductor substrate forms the drift region of the transistor device.

10. A method of fabricating a gate of a transistor device comprising a semiconductor substrate having a main surface, a cell field comprising a plurality of transistor cells of a vertical power transistor, a drain region of a first conductivity type at a second main surface which opposes the main surface, and an edge termination region laterally surrounding the cell field, the method comprising:
forming a body region of a second conductivity type which opposes the first conductivity type on a drift region of the first conductivity type in the cell field;
forming a source region of the first conductivity type on or in the body region in the cell field;
forming a gate trench in the main surface of the semiconductor substrate in the cell field;
lining the gate trench with a gate dielectric;
forming a metal gate electrode on the gate dielectric; and
forming an electrically insulating cap on the metal gate electrode and within the gate trench.

11. The method of claim 10, wherein the gate dielectric is deposited onto a base and side walls of the gate trench.

12. The method of claim 10, further comprising:
removing an upper portion of the metal gate electrode such that an upper surface of the metal gate electrode is recessed within the gate trench.

13. The method of claim 10, further comprising:
selectively forming a first electrically insulating layer on the main surface of the semiconductor substrate laterally adjacent the gate trench.

14. The method of claim 13, further comprising:
forming a second electrically insulating layer on the first electrically insulating layer and on the metal gate electrode in the gate trench to form the electrically insulating cap.

15. The method of claim 10, further comprising:
forming a lower dielectric layer arranged at a base of the gate trench; and
forming the gate dielectric on side walls of the gate trench and on an upper surface of the lower dielectric layer.

16. The method of claim 15, further comprising:
forming an upper dielectric layer on the metal gate electrode to form the electrically insulating cap, the upper dielectric layer having an upper surface that is substantially coplanar with the main surface of the semiconductor substrate; and
forming a second electrically insulating layer on the upper dielectric layer and on the main surface of the semiconductor substrate.

17. The method of claim 10, further comprising:
after forming the electrically insulating cap, implanting the body region and the source region into the main surface of the semiconductor substrate.

18. The method of claim 10, wherein both the body region and the source region are in direct contact with the gate dielectric.

19. The method of claim 10, wherein the semiconductor substrate forms the drift region of the transistor device.

20. A method of fabricating a gate of a transistor device comprising a semiconductor substrate having a main surface, a cell field comprising a plurality of transistor cells, and an edge termination region laterally surrounding the cell field, the method comprising:
forming a gate trench in the main surface of the semiconductor substrate in the cell field;
lining the gate trench with a gate dielectric;
forming a metal gate electrode on the gate dielectric;
forming an electrically insulating cap on the metal gate electrode and within the gate trench; and
after forming the electrically insulating cap, implanting a body region and a source region into the main surface of the semiconductor substrate.

* * * * *